United States Patent
Niemi

(10) Patent No.: US 8,130,874 B2
(45) Date of Patent: Mar. 6, 2012

(54) BY-PASS ARRANGEMENT OF A LOW NOISE AMPLIFIER

(75) Inventor: Mika Niemi, Kempele (FI)

(73) Assignee: Powerwave Comtek Oy, Kempele (FI)

( * ) Notice: Subject to any disclaimer, the term of this patent is extended or adjusted under 35 U.S.C. 154(b) by 680 days.

(21) Appl. No.: 11/945,363

(22) Filed: Nov. 27, 2007

(65) Prior Publication Data

US 2008/0107216 A1 May 8, 2008

Related U.S. Application Data

(63) Continuation of application No. PCT/FI2006/050204, filed on May 22, 2006.

(30) Foreign Application Priority Data

Jun. 7, 2005 (FI) .................................. 20055292

(51) Int. Cl.
 H03D 3/18 (2006.01)
 H03F 1/00 (2006.01)
(52) U.S. Cl. ....................................... 375/328; 330/151
(58) Field of Classification Search .................. 375/328, 375/349; 330/51, 151; 333/101
See application file for complete search history.

(56) References Cited

U.S. PATENT DOCUMENTS

| 4,078,217 | A | 3/1978 | Beno |
| 6,516,206 | B2 * | 2/2003 | Jantti ............................ 455/561 |
| 6,710,650 | B1 | 3/2004 | Beaudin et al. |
| 6,812,786 | B2 | 11/2004 | Jackson et al. |
| 2003/0193369 | A1 | 10/2003 | Jackson et al. |

FOREIGN PATENT DOCUMENTS

| EP | 1381162 | 1/2004 |
| JP | 2005020611 | 1/2005 |
| WO | 02052722 | 7/2002 |

* cited by examiner

*Primary Examiner* — Kevin Kim
(74) *Attorney, Agent, or Firm* — OC Patent Law Group

(57) ABSTRACT

The invention relates to an arrangement for bypassing a low noise amplifier unit in the front stage of a radio receiver, especially intended for the base stations of mobile communication networks. The front stage includes, in succession, a divider (420), an amplifier unit (430) comprising two parallel, low noise amplifier branches, and a first combiner (450). The by-pass arrangement includes a second combiner (443), by which the halves ($E_{11}$, $E_{12}$) of the received signal are combined immediately after the divider before the amplification. A change-over switch (SW) is then used to select either the signal that has propagated through the amplifier unit and then combined ($G \cdot E_1$) or the signal ($E_1'$) that has been directly combined as the output signal of the front stage. Due to the invention, the noise figure of the front stage is improved and the integration of its structure is facilitated.

9 Claims, 4 Drawing Sheets

BY-PASS ARRANGEMENT OF A LOW NOISE AMPLIFIER

The invention relates to an arrangement for bypassing a low noise amplifier unit in the front stage of a radio receiver. The arrangement is suitable for use primarily in base stations of mobile communication networks.

BACKGROUND OF THE INVENTION

In all radio receivers, the first amplifier after the antenna when entering the receiver should be of especially low noise type, because the signal level at the input of this amplifier is low, and the additional noise caused by the amplifier is further amplified in all the following amplifier stages. Therefore, the low noise first amplifier is generally referred to by the acronym LNA. In base stations of mobile communication networks, the highest permitted noise figure specified for the front stage of a receiver including, in addition to a LNA, an antenna filter among other things, is typically 1.8 dB. This limit must be adhered to, even if the front stage included a switching arrangement for bypassing the LNA, which arrangement causes additional noise. The by-pass of the LNA is necessary for some measurements related to the maintenance of the base station and in a fault condition of the LNA.

FIG. 1 presents as block diagram a part of a typical radio receiver on the side of the antenna and a known way of arranging the by-pass of the low noise amplifier. The figure shows an antenna ANT and from it forward in succession on the signal path of the receiver an antenna filter 110, a first switch SW1, an amplifier unit 130 containing the LNA, a second switch SW2, a passband filter FIL and a mixer MIX. The antenna filter 110 is of the band-pass type in its entirety; physically it may contain a band-pass part and a low-pass part in succession. Switches SW1 and SW2 are change-over switches, and they have shared control C. When the switches are in position 1, the output signal of the antenna filter is directed through switch SW1 to the input of the LNA, and the output signal of the LNA through switch SW2 forward towards the mixer. When the switches are in position 2, the output signal of the antenna filter 110 is directed through switch SW1 to the by-pass path 140 and through switch SW2 forward towards the mixer. Thus the LNA is passed.

FIG. 2 presents as block diagram a front stage of a radio receiver, in which the amplifier unit contains two parallel amplifier branches, and a known way to arrange the by-pass of such an amplifier unit. By forming the amplifier unit 230 of parallel branches instead of a single LNA, the impedance matching of the amplifier unit towards the antenna filter is facilitated. In addition, a wider dynamic and linear area and a better stability are achieved. Because of the parallel amplifier branches, the signal $E_1$ coming from the antenna filter 210 is divided into two similar parts $E_{11}$ and $E_{12}$ in the divider 220. The phase of the first division signal $E_{11}$ is changed 90 degrees in the first phase shifter and is then amplified in the first LNA. The second division signal $E_{12}$ is amplified in the second LNA, and the signal phase is then changed by 90 degrees in the second phase shifter. The partial signals, again of the same phase, are summed in the combiner 250, the output signal of which continues towards the mixer of the receiver.

The by-pass arrangement of the amplifier unit 230 is similar to that of amplifier unit 130 in FIG. 1 At the output of the antenna filter 210, before the divider 220, there is the first change-over switch SW1, by which the input signal $E_1$ can be directed either to the divider and through it to the amplifier unit 230 or the by-pass path 240. By the second change-over switch SW2, either the signal received from the combiner 250 or the signal coming from the by-pass path can be connected to the mixer. The change-over switches are controlled by a shared control signal C.

In the arrangements of FIGS. 1 and 2, the first switch SW1 and the second switch SW2 can be implemented by pin diodes, MMIC components (Microwave Monolithic Integrated Circuit), MEMS switches (microelectro-mechanical system) or relays. The attenuation caused by a single switch on the signal is of the order of 0.25 dB. The attenuation of the switch on the front side of the LNA increases the noise figure of the receiving end by the same amount. On the output side of the LNA the effect of the switch on the noise figure is not so substantial. Another drawback caused by the switches is that in the normal operation state of the front stage, the separation attenuation, or isolation, to the by-pass path of the LNA is finite and not infinite. This again deteriorates the noise figure of the front stage. The switches can be designed to have very high isolation, but then the losses caused by them increase in practice.

FIG. 3 presents a by-pass arrangement known from the application publication EP1381162A2, by which the above mentioned drawback caused by the switches is reduced. The front stage is like the one shown in FIG. 1 in that it similarly includes an antenna filter 310, an amplifier unit 330 containing one LNA, a by-pass path 340 and a change-over switch SW of the output side. The difference to FIG. 1 is that the first change-over switch SW1 has been left out, and instead of it the antenna filter 310 has been provided with two parallel outputs. The first output OUT1 is connected directly to the input of the amplifier unit, and the second output OUT2 is connected directly to the by-pass path 340. The output of the amplifier unit is connected to the first change terminal of the change-over switch SW, and the by-pass path to the second change terminal of the change-over switch SW. By the control signal C it is determined which change terminal becomes connected to the output terminal of the change-over switch SW.

The antenna filter 310 is of the resonator type. Its parallel outputs have been implemented so that there are two coupling elements in the cavity of the last resonator on the signal path. Each of these is connected to its own connector on the wall of the filter. The switching elements are located in the resonator cavity such that they give out signals of the same level if the load were the same. During the normal operation of the front stage, the transmission path from the second output OUT2 towards the by-pass path of the amplifier LNA has a high impedance, and then it does not load the feeding source, or the antenna.

The solution according to FIG. 3 can as well be applied in the case of FIG. 2 by replacing its first switch SW1 by parallel outputs of the antenna filter.

SUMMARY OF THE INVENTION

The object of the invention is to implement a by-pass arrangement of a low noise amplifier unit in the front stage of a radio receiver in a new and advantageous manner. The arrangement according to the invention is characterized in what is set forth in the independent claim 1. Some preferred embodiments of the invention are set forth in the other claims.

The invention is applied to the structure of a front stage having an amplifier unit with two parallel low noise amplifier branches, a divider on its input side and a first combiner on the output side. Its basic idea is the following: In order to bypass the amplifier unit, the structure is complemented by another combiner, by which the halves of the input signal are combined after said divider without amplification. As the output signal of the front stage is then selected by a change-over switch either the signal that has propagated through the amplifier unit and then combined or the signal that has been directly combined. When the by-pass path is not in use, the input lines of the second combiner are connected to have a high impedance as seen from the divider.

The invention has the advantage that the noise figure of the front stage is improved. This is firstly due to the fact that a switch being located between the antenna filter and the LNA amplifier unit and deteriorating the noise figure most, is not required. On the other hand it is due to the fact that the isolation to the by-pass path of the amplifier unit increases. In addition, the invention has the advantage that the impedance measured from the output of the antenna filter can be made relatively independent on whether the amplifier or by-pass path is in use, which facilitates the integration of the front structure. The equality of the impedance is due to the above-mentioned connecting arrangement of the input lines of the combiner.

BRIEF DESCRIPTION OF THE DRAWINGS

In the following, the invention will be described in more detail. Reference will be made to the accompanying drawings, in which.

DETAILED DESCRIPTION OF THE INVENTION

Figure 1:
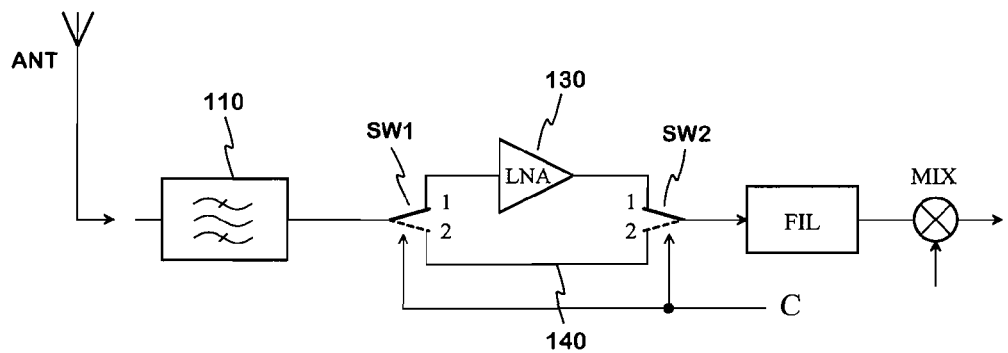
FIG. 1 shows an example of a prior art by-pass arrangement of a low noise amplifier unit as a block diagram.
Figure 2:
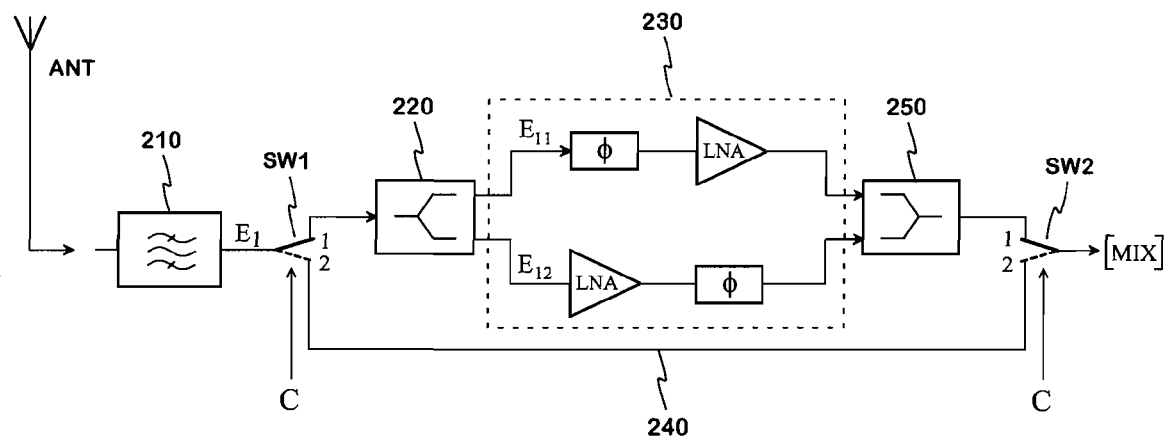
FIG. 2 shows another example of a prior art by-pass arrangement of a low noise amplifier unit as a block diagram.
Figure 3:
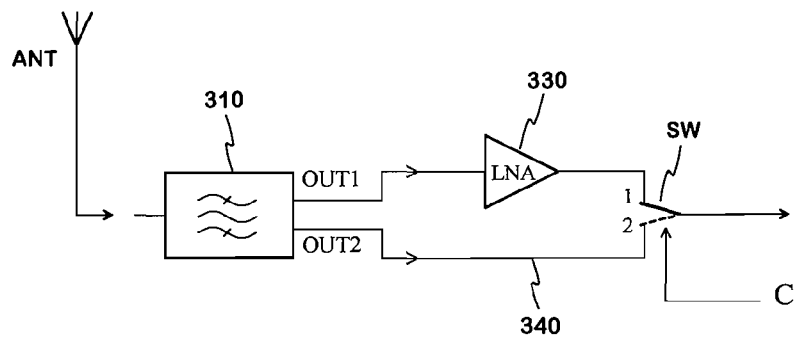
FIG. 3 shows a third example of a prior art by-pass arrangement of a low noise amplifier unit as a block diagram.

FIGS. 1, 2 and 3 were already discussed in connection with the description of the prior art.

Figure 4:
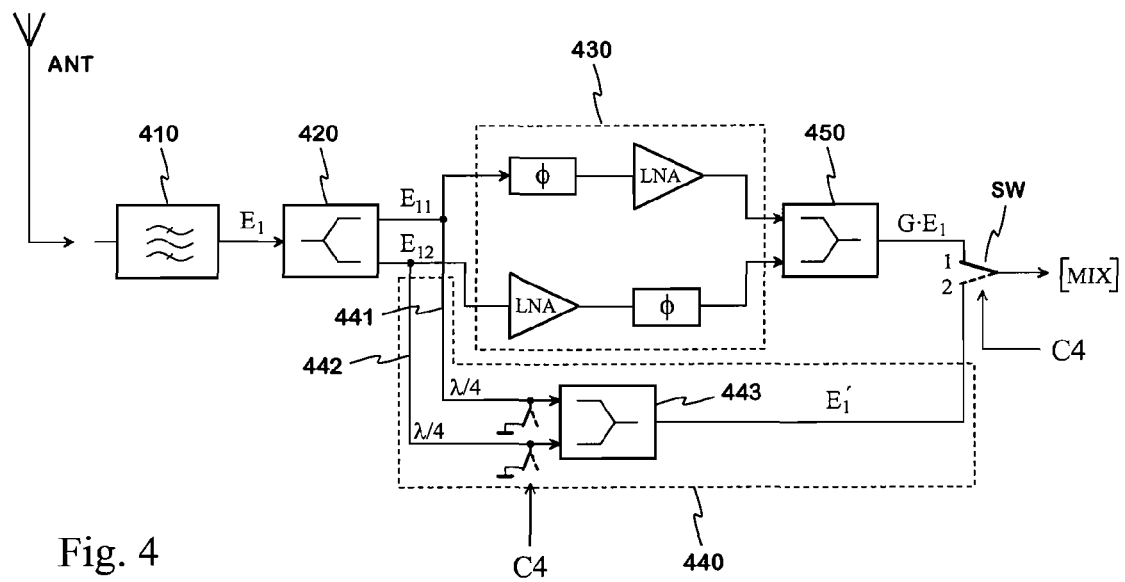
FIG. 4 shows an example of a by-pass arrangement of a low noise amplifier unit according to the invention as a block diagram.

FIG. 4 presents an example of a by-pass arrangement of a low noise amplifier unit according to the invention. In the drawing there is as block diagram a front stage of a radio receiver, which front stage is like the one shown in FIG. 2, except for the by-pass arrangement. Thus the received and filtered input signal $E_1$ is divided into two similar parts $E_{11}$ and $E_{12}$ in the divider 420, and these division signals are amplified in different phases each in its own branch of the amplifier unit 430. Again, the in-phase signal halves are summed in the combiner 450, the output signal $G·E_1$ of which continues during normal operation towards the mixer of the receiver.

The by-pass arrangement of the amplifier unit 430 includes a similar change-over switch SW on the output side of the front stage as also in the arrangement according to FIG. 2. The first change terminal of the change-over switch is connected to the output of the combiner 450 and the second change terminal to the output of the by-pass path 440. The output terminal of the change-over switch gives the output signal of the whole front stage, and it can be selected by the change-over switch to be either the amplified signal $G·E_1$ or the output signal of the by-pass path 440. The by-pass arrangement of the amplifier unit 430 differs from the by-pass arrangement according to FIG. 2 in that there is no switch between the antenna filter 410 and the divider 420, and that the by-pass path 440 includes as an essential part another combiner 443 in addition to a mere transmission line. The by-pass path of the amplifier unit 430 starts from the output side of the divider 420. The first output of the divider has been connected by the first by-pass line 441 to the first input of the second combiner 443, and the second output of the divider by the second by-pass line 442 to the second input of the second combiner. The second combiner then sums the division signals $E_{11}$ and $E_{12}$ into the output signal $E_1$ of the by-pass path, and the output of the second combiner is the output of the by-pass path.

According to the above-described, the starting end of the by-pass path 440 is always parallel with the input of the amplifier unit, because both have a fixed connection to the two outputs of the divider 420. In order to prevent the by-pass path from deteriorating the matching of the transmission path during normal operation, an additional arrangement is required. Switches connected in series are not a good solution, because the intention is to get rid of just them on the transmission paths of the unamplified signal. Instead of that, a closing switch, which in the closing state shorts the by-pass line, has been added to both inputs of the second combiner 443. The length of each by-pass line 441, 442 from the node on the output side of the divider to the closing switch has a length of the quarter wave $\lambda/4$ on the operating frequencies. For this reason, the shorted by-pass line corresponds to a parallel resonance circuit in resonance as seen from said node. Then its impedance is very high, and therefore it does not impair the matching of the transmission path continuing to the amplifier unit. When the by-pass path is taken into use, the closing switches are made non-conductive, in which case they do not have a significant effect on the operation of the circuit. The closing switches are controlled by the same shared control signal C4 as the change-over switch SW.

Also in the structure according to the invention, all switches can be implemented by pin diodes, MMIC components or MEMS switches, for example.

Figure 5:
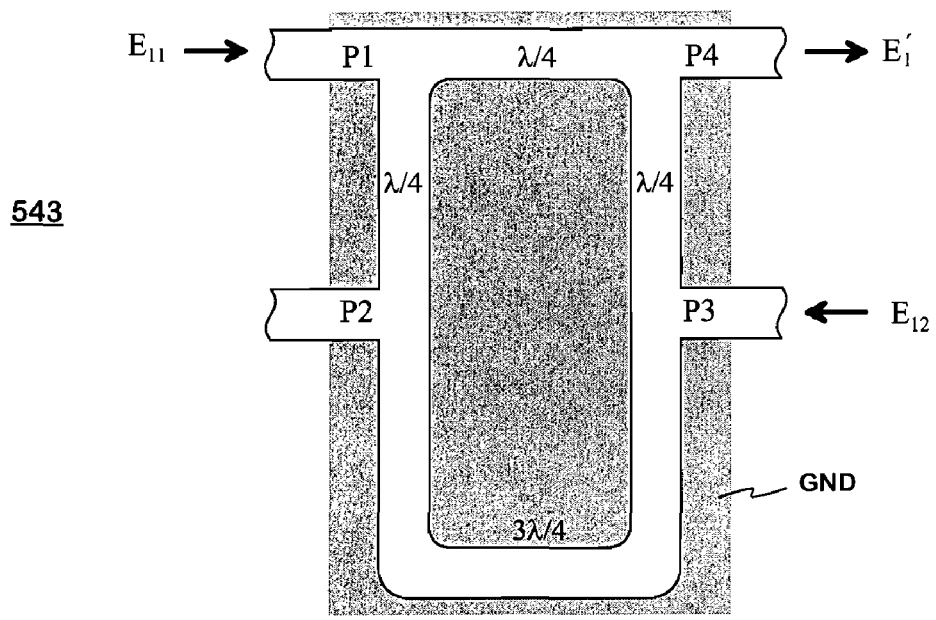
FIG. 5 shows an example of a combiner belonging to the by-pass arrangement according to FIG. 4.

FIG. 5 shows an example of a combiner belonging to the by-pass arrangement according to FIG. 4. The combiner 543 is of the hybrid type, it has a first P1, second P2, third P3 and fourth P4 port, through which external lines join to the ring-like transmission path of the hybrid. The port distances P1-P2, P3-P4 and P4-P1 are a quarter wave long at the operating frequency, and the port distance P2-P3 is three fourths of the wavelength. In this case, when identical signals $E_{11}$ and $E_{12}$ in the same phase are fed to the ports P1 and P3, they have the same phase also at the port P4. Thus the sum signal $E_1'$ is obtained from the port P4. At the port P2, the signals $E_{11}$ and $E_{12}$ are in the opposite phases, and therefore nothing enters the load that possibly exists in port P2. The combiner 543 has low losses, especially when the hybrid is air-insulated.

Figure 6:
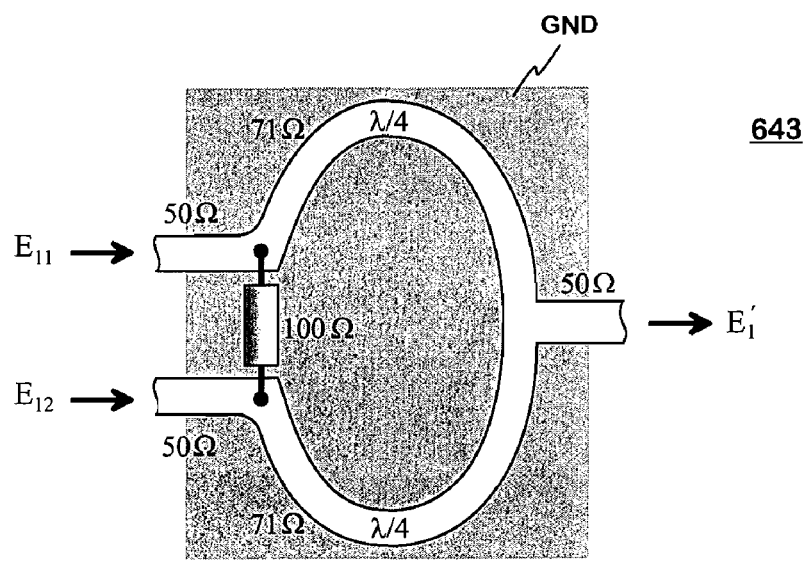
FIG. 6 shows another example of a combiner belonging to the by-pass arrangement according to FIG. 4.

FIG. 6 shows another example of a combiner belonging to the by-pass arrangement according to FIG. 4. The combiner 643 is a two-branch Wilkinson combiner. In the example of the figure, the impedance of the input lines is chosen as 50Ω. The input lines continue as having an impedance of 71Ω for a quarter wave length and are then joined to an output line of 50Ω. In addition, the starting ends of the ground-insulated conductors of the lines of 71Ω have been connected together by a resistor having a resistance of 100Ω. In this case a sum signal $E_1'$ is obtained to the output line from the in-phase input signals $E_{11}$ and $E_{12}$. The combining is loss-less, because hardly any current runs in the resistor.

Figure 7:
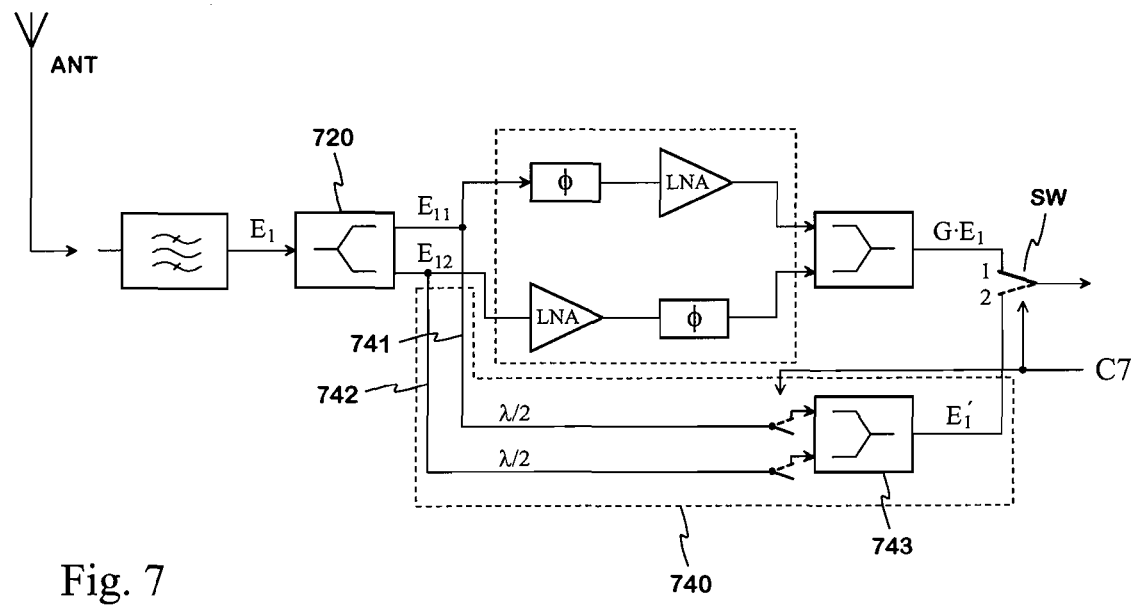
FIG. 7 shows another example of a by-pass arrangement of a low noise amplifier unit according to the invention as a block diagram.

FIG. 7 shows another example of a by-pass arrangement of a low noise amplifier unit according to the invention. The normal path of a signal coming from the antenna consists of a passband filter, divider 720, two-branch amplifier unit, combiner and change-over switch SW, which are similar as in FIG. 4. On the by-pass path 740, there is also a first 741 and second 742 by-pass line and a second combiner 743 like in FIG. 4. The difference is that the by-pass lines are now a half-wave in length. Because of this, the closing switches in the inputs of the second combiner have now been arranged so that the by-pass lines are open at their tail end, when the front stage is in the normal operation state, or when the signal runs through the amplifier unit. A half-wave long line, which is open at its tail end, corresponds to a parallel resonance circuit as seen from the head end, and thus its impedance is very high.

Figure 8:
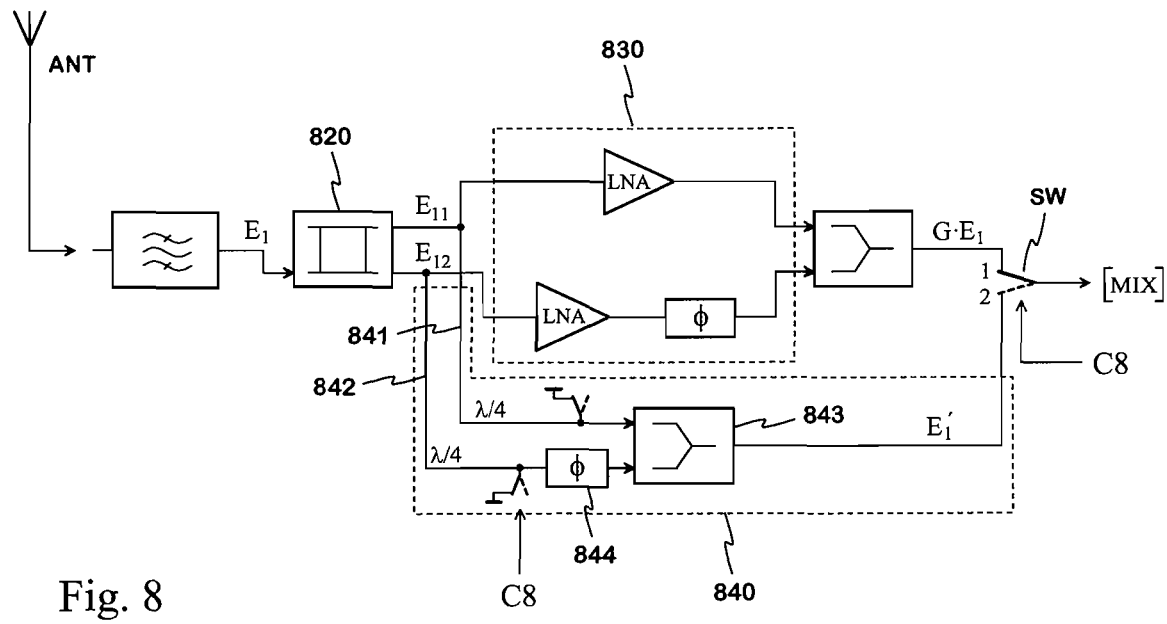
FIG. 8 shows a third example of a by-pass arrangement of a low noise amplifier unit according to the invention as a block diagram.

FIG. 8 shows a third example of a by-pass arrangement of a low noise amplifier unit according to the invention. The normal path of the signal coming from the antenna consists of a passband filter, divider 820, two-branch amplifier unit, combiner and change-over switch SW, like in FIG. 4. In this example, the divider is of a type that produces to the first output a signal $E_{11}$, which lags 90 degrees compared to the signal $E_{12}$ of the second output. Because of this, no phase shifter is needed in the first branch of the amplifier unit 830 before its low noise amplifier. Instead, one is needed in the second by-pass line 842 of the by-pass path 840 in order to cause the signals arriving at the second combiner 843 to have the same phase. The phase shifter 844 belonging to the second by-pass line is located at the tail end of the line, or the end at the side of the second combiner. The by-pass lines have a quarter wave length as measured from their head end to the closing switches of the lines. The closing switch of the first by-pass line 841 is in the input of the second combiner like in FIG. 4. The closing switch of said second by-pass line 842 again is in the input of the phase shifter 844. The closing switches are kept in the closing state when the front stage is in the normal operation state, or when the first change terminal of the change-over switch SW is connected to its output terminal. The phase shifter 844 can be a similar quarter wave line as also the head end of the second by-pass line.

The arrangement according to the invention has been described above mostly in principle. Naturally, there may be variation in the circuit-level solutions. For example, there may be an amplifier in addition to the passive combiner on the by-pass path of the amplifier unit. The inventive idea can be implemented in different ways within the limits set by the independent claim 1.

The invention claimed is:

1. An arrangement for bypassing a low noise amplifier unit in a front stage of a radio receiver, which amplifier unit has two parallel amplifier branches and the front stage comprises, in addition to the amplifier unit, an antenna filter to clean a received input signal, a divider to divide the input signal to said amplifier branches, and a first combiner to combine the output signals of the amplifier branches, the arrangement comprising a by-pass path for the amplifier unit and a change-over switch with a first change terminal, a second change terminal and an output terminal, which first change terminal is connected to the output of the first combiner and the second change terminal is connected to the output of the by-pass path to select a signal received either from the amplifier unit or the by-pass path as an output signal of the whole front stage, wherein said antenna filter is directly connected to the input of said divider and the outputs of the divider are directly connected to said amplifier branches, and the bypass path comprises a second combiner, a first input of which is connected by a first by-pass line to a first output of said divider and a second input by a second by-pass line to a second output of said divider, and an output of said second combiner is said output of the by-pass path, and said arrangement further comprises a first closing switch relatively close to a tail end of the first by-pass line, or the end on the side of the second combiner, and a second closing switch relatively close to a tail end of the second by-pass line and the first and the second closing switch and the change-over switch have a shared control such that the closing switches are in a closing state when the first change terminal of the change-over switch is connected to the output terminal of the change-over switch.

2. An arrangement according to claim 1, said divider being of a type that produces in-phase signals in the first and second output, and the length of said by-pass lines from the head end to the closing switches is a quarter wave length at the operating frequency.

3. An arrangement according to claim 1, said divider being of a type that produces in-phase signals in the first and second output, and the length of said by-pass lines from the head end to the closing switches is a half-wave length at the operating frequency.

4. An arrangement according to claim 1, said divider being of a type that produces to the first output a signal, which lags 90 degrees in comparison to the signal of the second output, wherein the second by-pass line comprises at its tail end, or the end on the side of the second combiner, a phase shifter causing a 90-degree phase shift, the length of said by-pass lines from the head end to the closing switches is a quarter wave length at the operating frequency.

5. An arrangement according to claim 1, the second combiner being of the hybrid type.

6. An arrangement according to claim 1, the second combiner being of the Wilkinson type.

7. An arrangement according to claim 2 or 3, the divider being of the Wilkinson type.

8. An arrangement according to claim 4, the divider being of the hybrid type.

9. An arrangement according to claim 2, 3 or 4, said switches having been implemented by pin diodes, MEMS switches or the MMIC technique.

\* \* \* \* \*